United States Patent
AlNahas et al.

[19]

[11] Patent Number: 6,147,517
[45] Date of Patent: Nov. 14, 2000

[54] VOLTAGE COMPARATOR CIRCUIT

[75] Inventors: Bassem M. AlNahas, Manchester, N.H.; Alex Gusinov, Lexington; Jeffrey B. Van Auken, Littleton, both of Mass.

[73] Assignee: Sipex Corporation

[21] Appl. No.: 09/162,675

[22] Filed: Sep. 29, 1998

Related U.S. Application Data

[60] Provisional application No. 60/060,831, Oct. 1, 1997.

[51] Int. Cl.[7] ......................................................... H03K 5/22
[52] U.S. Cl. ................................... 327/65; 66/67; 66/69; 66/70; 66/71; 66/72
[58] Field of Search .................................. 327/65, 66, 67, 327/69, 70, 71, 72

[56] References Cited

U.S. PATENT DOCUMENTS

| | | | |
|---|---|---|---|
| 5,065,045 | 11/1991 | Mok | 307/355 |
| 5,315,171 | 5/1994 | Blauer | 307/355 |
| 5,525,920 | 6/1996 | Rakers | 327/65 |

*Primary Examiner*—Margaret R. Wambach
*Assistant Examiner*—Cassandra Cox
*Attorney, Agent, or Firm*—Testa, Hurwitz & Thibeault, LLP

[57] ABSTRACT

Control circuit for providing the greater of a supply voltage $V_{CC}$ and a battery voltage $V_{BATT}$. A comparator compares $V_{CC}$ and $V_{BATT}$, and provides output signals to an inverting gain stage. A switch receives output signals from the inverting gain stage and provides the greater of $V_{CC}$ and $V_{BATT}$ as the circuit output and as the comparator supply voltage. The circuit output voltage rapidly switches between $V_{CC}$ and $V_{BATT}$ as the comparison status of the two voltages changes.

12 Claims, 7 Drawing Sheets

VOLTAGE COMPARATOR CIRCUIT

RELATED APPLICATIONS

This application claims priority to pending provisional application, Ser. No. 60/060,831, filed on Oct. 1, 1997, the contents of which are incorporated herein by reference.

FIELD OF THE INVENTION

The invention relates generally to voltage comparator circuits and more specifically to a voltage comparator circuit which compares a supply voltage ($V_{CC}$) with a battery voltage ($V_{BATT}$) and outputs the greater of the two voltages.

1. Background of the Invention

Comparison of two varying reference voltages to select the higher voltage can be accomplished using a comparator. This type of comparison is useful, for example, to switch from a supply voltage to a backup battery voltage when the supply voltage drops below a predetermined level. Unfortunately, the comparator requires a stable supply voltage or an independent voltage source for proper operation. It would be beneficial if such a comparison could be performed without the need for a stable supply voltage or an independent voltage source. For example, if would be advantageous for one of the reference voltages to be used as the circuit supply voltage.

2. Summary of the Invention

A voltage comparator circuit has been developed which is useful for switching between two voltages (e.g., a supply voltage $V_{CC}$ and a battery voltage $V_{BATT}$) in order to provide the greater of the two voltages as an output. The comparator circuit is powered by the greater of the two voltages and is designed so that during power up the comparator circuit determines the greater voltage and provides that as the circuit output voltage. Within the comparator circuit a comparator stage continuously compares the two voltages and provides the greater voltage at one comparator stage output terminal and a low logic level voltage at another comparator stage output terminal. An inverting gain stage provides sufficient gain to each comparator stage output voltage to ensure that the comparator circuit output voltage is rapidly switched between the two voltage levels as required during operation.

The voltage comparator circuit in one embodiment includes a comparator stage and a switch. The comparator stage includes a first, second and third input terminal, and a first and second output terminal. The comparator stage produces a voltage at one comparator stage output terminal equal to a first or second comparator voltage and a voltage at the other comparator stage output terminal equal to the second or a third comparator voltage in response to a voltage applied to each comparator stage input terminal. The switch includes a first and second input terminal in electrical communication with the first and second comparator stage output terminals, respectively, and a switch output terminal in electrical communication with the third comparator stage input terminal. The switch produces a voltage at the switch output terminal substantially equal to a first or second reference voltage in response to the voltages applied to its input terminals.

In another embodiment, the voltage comparator circuit includes a comparator stage, an inverting gain stage and a switch. The comparator stage includes a first, second, third and fourth input terminal and a first and second output terminal. The comparator stage produces a voltage at the first comparator stage output terminal equal to a first or second comparator voltage and a voltage at the second comparator stage output terminal equal the second or a third comparator voltage, in response to the voltages applied to the first and second comparator stage input terminals. The inverting gain stage includes first and second gain input terminals in electrical communication with the first and second comparator stage output terminals, respectively, and a first and second gain output terminal. The inverting gain stage produces a first gain output voltage equal to a first or second gain voltage and a second gain output voltage equal to the second or a third gain voltage at the first and second gain output terminals, respectively, in response to a voltage applied to each gain input terminal. The switch includes a first and second input terminal in electrical communication with the first and second gain output terminals, respectively, a third and fourth switch input terminal, and a switch output terminal in electrical communication with the fourth comparator stage input terminal. The switch produces a voltage at the switch output terminal substantially equal to a first reference voltage applied to the third switch input terminal or a second reference voltage applied to the fourth switch input terminal in response to a voltage applied to the first switch input terminal and a voltage applied to the second switch input terminal.

The invention also relates to a method for applying one of a first reference voltage and a second reference voltage to a circuit. The method includes comparing a first and second reference voltage and generating a first output voltage substantially equal to one of said second reference voltage and a third reference voltage in response to the comparison and further in response to a third input voltage. The method includes the additional steps of generating a second output voltage substantially equal to one of said first and third reference voltages in response to said comparison and further in response to the third reference voltage, and generating a voltage comparator output voltage substantially equal to the first or second reference voltages in response to the first and second output voltages. In a further embodiment, the method includes the step of applying the voltage comparator output voltage as the third input voltage.

In one embodiment, the method includes the steps of comparing a first and a second reference voltage and generating a first and a second output voltage in response to the comparison. The first output voltage is substantially equal to the second reference voltage or a third reference voltage, and the second output voltage is substantially equal to one of the first or third reference voltages. The method includes the further steps of generating, in response to the first and second output voltages, a third output voltage substantially equal to the first or third reference voltage, a fourth output voltage substantially equal to the second or third reference voltage, and a voltage comparator output voltage substantially equal to the first or second reference voltage in response to the third and fourth output voltages.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

Like reference characters in the respective drawn figures indicate corresponding parts.

DETAILED DESCRIPTION OF THE INVENTION

Figure 1:
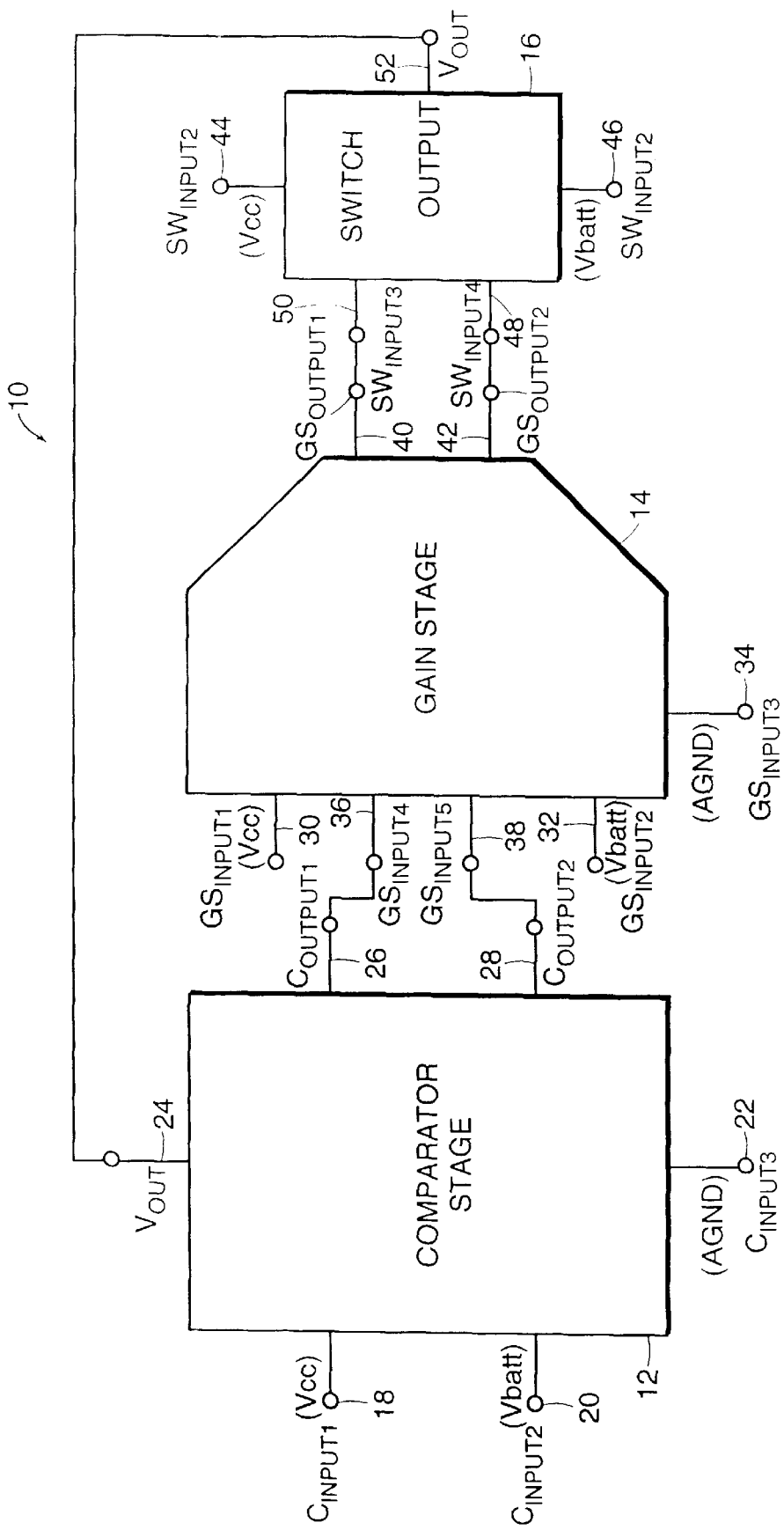
FIG. 1 is a block diagram of an embodiment of a voltage comparator circuit in accordance with the present invention.

Referring to FIG. 1 and in brief overview, an embodiment of a voltage comparator circuit 10 constructed in accordance with the invention includes a comparator stage 12, a gain stage 14, and a switch 16. The voltage comparator circuit 10 compares two input voltages and outputs the greater of the two input voltages as $V_{OUT}$.

The comparator stage 12 compares two input voltages and has a first input terminal 18 for receiving a first input voltage $C_{INPUT1}$ and a second input terminal 20 for receiving a second input voltage $C_{INPUT2}$. In the embodiment shown in FIG. 1, the first input voltage $C_{INPUT1}$ is equal to a supply voltage $V_{CC}$ and the second input voltage $C_{INPUT2}$ is equal to a battery voltage $V_{BATT}$. In this embodiment, the voltage comparator circuit 10 outputs the greater of $V_{CC}$ and $V_{BATT}$ as $V_{OUT}$. While an embodiment of the voltage comparator circuit 10 which compares a supply voltage $V_{CC}$ to a battery voltage $V_{BATT}$ is described below, the voltage comparator circuit 10 may also be used to compare other voltages. The comparator stage 12 also has a third input terminal 22 for receiving a third input voltage $C_{INPUT3}$, a fourth input terminal 24 for receiving the output voltage $V_{OUT}$ of the voltage comparator circuit 10, and two output terminals 26, 28 for outputting two output voltages $C_{OUTPUT1}$ and $C_{OUTPUT2}$, respectively. In the embodiment shown in FIG. 1, the third input voltage is ground. In other embodiments, the third input voltage may be another voltage which corresponds to logic low. The output voltages $C_{OUTPUT1}$ and $C_{OUTPUT2}$ are complementary. That is, if $C_{OUTPUT1}$ is a logic high or asserted, $C_{OUTPUT2}$ will be a logic low or unasserted and vice versa. If the first comparator stage input voltage $C_{INPUT1}$ ($V_{CC}$) is greater than the second comparator stage input voltage $C_{INPUT2}$ ($V_{BATT}$), the output voltage $C_{OUTPUT1}$ is low or unasserted and the output voltage $C_{OUTPUT2}$ is high or asserted. Conversely, if the second comparator stage input voltage $C_{INPUT2}$ ($V_{BATT}$) is greater than the first comparator stage input voltage $C_{INPUT1}$ ($V_{CC}$), then the output voltage $C_{OUTPUT1}$ is high or asserted and the output voltage $C_{OUTPUT2}$ is low or unasserted. The comparator stage 12 will be described in more detail below in the discussion of FIG. 2.

The gain stage 14 has a first input terminal 30 for receiving a first gain stage input voltage $GS_{INPUT1}$, a second input terminal 32 for receiving a second gain stage input voltage $GS_{INPUT2}$, and a third input terminal 34 for receiving a third gain stage input voltage $GS_{INPUT3}$. In the embodiment shown in FIG. 1, the first gain stage input voltage $GS_{INPUT1}$ is the supply voltage $V_{CC}$, the second gain stage input voltage $GS_{INPUT2}$ is the battery voltage $V_{BATT}$, and the third gain stage input voltage $GS_{INPUT3}$ is ground. As described above, in other embodiments of the voltage comparator circuit 10, $GS_{INPUT1}$, $GS_{INPUT2}$, and $GS_{INPUT3}$ may be voltages other than $V_{CC}$, $V_{BATT}$, and ground, respectively.

The gain stage 14 has a fourth input terminal 36 electrically coupled to the first output terminal 26 of the comparator stage 12 and a fifth input terminal 38 electrically coupled to the second output terminal 28 of the comparator stage 12 for receiving the output voltages $C_{OUTPUT1}$ and $C_{OUTPUT2}$ respectively. The gain stage 14 also has two output terminals 40, 42 for outputting two output voltages $GS_{OUTPUT1}$ and $GS_{OUTPUT2}$, respectively.

The output voltages $GS_{OUTPUT1}$ and $GS_{OUTPUT2}$ are complementary. That is, if $GS_{OUTPUT1}$ is a logic high or asserted, $GS_{OUTPUT2}$ will be a logic low or unasserted and vice versa. If the first comparator stage input voltage $C_{INPUT1}$ ($V_{CC}$) is greater then the second comparator stage input voltage $C_{INPUT2}$ ($V_{BATT}$), the output voltage $GS_{OUTPUT1}$ is low or unasserted and the output voltage $GS_{OUTPUT2}$ is high or asserted. Conversely, if $C_{INPUT2}$ ($V_{BATT}$) is greater than the $C_{INPUT1}$ ($V_{CC}$), the output voltage $GS_{OUTPUT1}$ is high or asserted and the output voltage $GS_{OUTPUT2}$ is low or unasserted. The gain stage 14 will be described in more detail below in the discussion of FIG. 3.

The switch 16 has a first input terminal 44 for receiving a first switch input voltage $SW_{INPUT1}$ and a second input terminal 46 for receiving a second switch input voltage $SW_{INPUT2}$. In the embodiment shown in FIG. 1, the first switch input voltage is the supply voltage $V_{CC}$ and the second switch input voltage is the battery voltage $V_{BATT}$. As described above, in other embodiments, the first and second switch input voltages may be voltages other than $V_{CC}$ and $V_{BATT}$. The switch 16 has a third input terminal 48 electrically coupled to the first output terminal 40 of the gain stage 14 and a fourth input terminal 50 electrically coupled to the second output terminal 42 of the gain stage 14. The third input terminal 48 and the fourth input terminal 50 of the switch 16 receive the output voltages $GS_{OUTPUT1}$ and $GS_{OUTPUT2}$ from the gain stage 14, respectively. The switch 16 produces an output voltage $V_{OUT}$ at an output terminal 52. The output voltage $V_{OUT}$ from the output terminal 52 of the switch 16 varies between a first state substantially equal to the first switch input voltage $SW_{INPUT1}$ ($V_{CC}$) and a second state substantially equal to the second switch input voltage $SW_{INPUT2}$ ($V_{BATT}$) depending on which of the first and second comparator input voltages $C_{INPUT1}$ ($V_{CC}$) and $C_{INPUT2}$ ($V_{BATT}$) is greater. The switch 16 will be described in more detail below in the discussion of FIG. 4.

Figure 2:
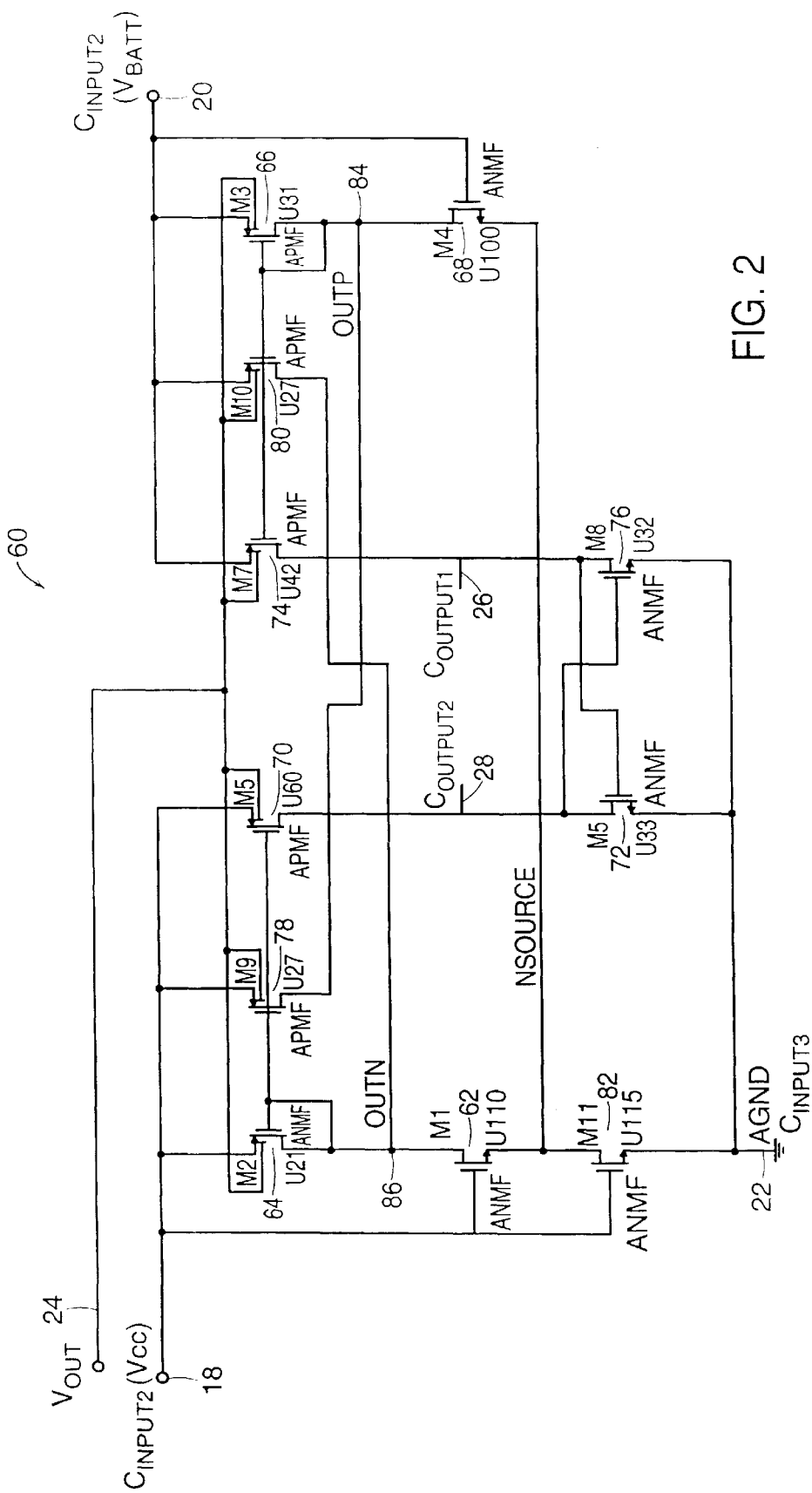
FIG. 2 is a schematic diagram of an embodiment of the comparator stage of the voltage comparator circuit of FIG. 1.

FIG. 2 shows a more detailed schematic of one embodiment 60 of the comparator stage 12 shown in FIG. 1. The purpose of the comparator stage 60 is to compare the two comparator stage input voltages $C_{INPUT1}$ ($V_{CC}$) and $C_{INPUT2}$ ($V_{BATT}$) and to output two output voltages $C_{OUTPUT1}$ and $C_{OUTPUT2}$ corresponding to logic high and logic low in response thereto. The comparator stage 60 includes eleven transistors M1 62, M2 64, M3 66, M4 68, M5 70, M6 72, M7 74, M8 76, M9 78, M10 80, and M11 82. The transistor M11 82 acts as a current source. The sources of the transistors M2 64, M5 70 and M9 78 are electrically coupled to the first input terminal 18 and receive the first comparator stage input voltage $C_{INPUT1}$ ($V_{CC}$). The sources of the transistors M3 66, M7 74 and M10 80 are electrically coupled to the second input terminal 20 and receive the second comparator stage input voltage $C_{INPUT2}$ ($V_{BATT}$). The substrates, or wells, of the transistors M2 64, M3 66, M5 70, M7 74, M9 78 and M10 80 are electrically coupled to the input terminal 24 and receive the output voltage $V_{OUT}$. The purpose of electrically coupling the substrates of the transistors M2 64, M3 66, M5 70, M7 74, M9 78 and M10 80 to the input terminal 24 is to ensure that the substrates are electrically coupled to the highest potential in the circuit to prevent latchup. As the output voltage $V_{OUT}$ will be the greater of the first input voltage $V_{CC}$ and the second input voltage $V_{BATT}$, the substrates will be electrically coupled to the highest potential. The operation of the comparator stage 60 will be explained for the case in which the second comparator stage input voltage $C_{INPUT2}$ ($V_{BATT}$) is greater than the first comparator stage input voltage $C_{INPUT1}$ ($V_{CC}$) and the case in which the first comparator stage input voltage $C_{INPUT1}$ ($V_{CC}$) is greater than the second comparator stage input voltage $C_{INPUT2}$ ($V_{BATT}$).

If $V_{BATT}$ is greater than $V_{CC}$, the transistor M1 62 turns off and behaves nearly as an open circuit and the transistor M4 68 turns on and behaves nearly as a short circuit. As M1 62 behaves nearly as an open circuit, almost all of the current from the transistor M11 82 flows through the transistor M4 68. The node 84 is electrically coupled to the third comparator stage input voltage $C_{INPUT3}$ through the transistors M11 82 and M4 68. As $C_{INPUT3}$ is ground, the node 84 is electrically coupled to ground and the signal OUTP is pulled low. The node 84 is also electrically coupled to the gates of the transistors M3 66, M7 74 and M10 80. As the node 84 is low, the transistors M3 66, M7 74 and M10 80 are on and conduct current. The drain of the transistor M10 80 is electrically coupled to node 86, which is in turn electrically coupled to the gates of the transistors M2 64, M5 70 and M9 78. As the transistor M10 80 is on, the signal OUTN is electrically coupled to the second comparator stage input voltage $C_{INPUT2}$ ($V_{BATT}$) and the node 86 is high. The node 86 being high and the transistor M1 62 being off causes the transistors M2 64, M5 70 and M9 78 to turn off and behave as open circuits. As the transistor M7 74 is on, the first output terminal 26 is electrically coupled to $C_{INPUT2}$ ($V_{BATT}$) and the output voltage $C_{OUTPUT1}$ is high. The gate of transistor M6 72 is also electrically coupled to $C_{INPUT2}$ ($V_{BATT}$), thereby causing the transistor M6 72 to turn on and electrically couple the second output terminal 28 to the third comparator stage input voltage $C_{INPUT3}$ (ground). As the output terminal 28 is electrically coupled to ground, the output voltage $C_{OUTPUT2}$ is low.

In summary, when the second comparator stage input voltage $C_{INPUT2}$ ($V_{BATT}$), is greater than the first comparator stage input voltage $C_{INPUT1}$ ($V_{CC}$), the output voltage $C_{OUTPUT1}$ is high (equal to $V_{BATT}$) and the output voltage $C_{OUTPUT2}$ is low (equal to ground).

If the first comparator stage input voltage $C_{INPUT1}$ ($V_{CC}$) is greater than the second comparator stage input voltage $C_{INPUT2}$ ($V_{BATT}$), the transistor M4 68 is nearly off and the transistor M1 62 is nearly on, thereby causing almost all of the current from M11 82 to flow through the transistor M1 62. The transistor M1 62 being nearly on causes the node 86 to be electrically coupled to the third comparator stage input voltage $C_{INPUT3}$ (ground) and the signal OUTN to be low. The signal OUTN being low causes the transistors M2 64, M5 70 and M9 78 to turn on. The drain of the transistor M9 78 is electrically coupled to the node 84. The transistor M9 78 being on causes the node 84 to be electrically coupled to $C_{INPUT1}$ ($V_{CC}$) and the OUTP signal to be high. The OUTP signal being high turns transistors M3 66, M7 74 and M10 80 off. The transistor M5 70 being on electrically couples the second output terminal 28 to $C_{INPUT1}$ ($V_{CC}$) and causes the output voltage $C_{OUTPUT2}$ to be high. The transistor M5 70 being on also causes transistor M6 72 to turn off and transistor M8 76 to turn on, thereby electrically coupling the first output terminal 26 to $C_{OUTPUT3}$ (ground) and causing the output voltage $C_{INPUT1}$ to be low.

In summary, when the first comparator stage input voltage $C_{INPUT1}$ ($V_{CC}$) is greater than the second comparator stage input voltage $C_{INPUT2}$ ($V_{BATT}$), the output voltage $C_{OUTPUT2}$ is high (equal to $V_{CC}$) and the output voltage $C_{OUTPUT1}$ is low (equal to ground).

Below is a table summarizing the states of the transistors and output signals for the case in which the first comparator stage input voltage $C_{INPUT1}$ ($V_{CC}$) is greater than the second comparator stage input voltage $C_{INPUT2}$ ($V_{BATT}$) and the case in which the second comparator stage input voltage $C_{INPUT2}$ ($V_{BATT}$) is greater than the first comparator stage input voltage $C_{INPUT1}$ ($V_{CC}$).

TABLE 1

STATES OF THE TRANSISTORS AND OUTPUT VOLTAGES OF THE COMPARATOR STAGE

|  | $C_{INPUT} > C_{INPUT1}$ ($V_{BATT} > VCC$) | $C_{INPUT1} > C_{INPUT2}$ ($V_{CC} > V_{BATT}$) |
| --- | --- | --- |
| M1 | OFF | ON |
| M2 | OFF | ON |
| M3 | ON | OFF |
| M4 | ON | OFF |
| M5 | OFF | ON |
| M6 | ON | OFF |
| M7 | ON | OFF |
| M8 | OFF | ON |
| M9 | OFF | ON |
| M10 | ON | OFF |
| OUTP | LOW(GND) | HIGH ($V_{CC}$) |
| OUTN | HIGH ($V_{BATT}$) | LOW (GND) |
| $C_{OUKTPUT1}$ | HIGH ($V_{BATT}$) | LOW (GND) |
| $C_{OUTPUT2}$ | LOW(GND) | HIGH ($V_{CC}$) |

Figure 3:
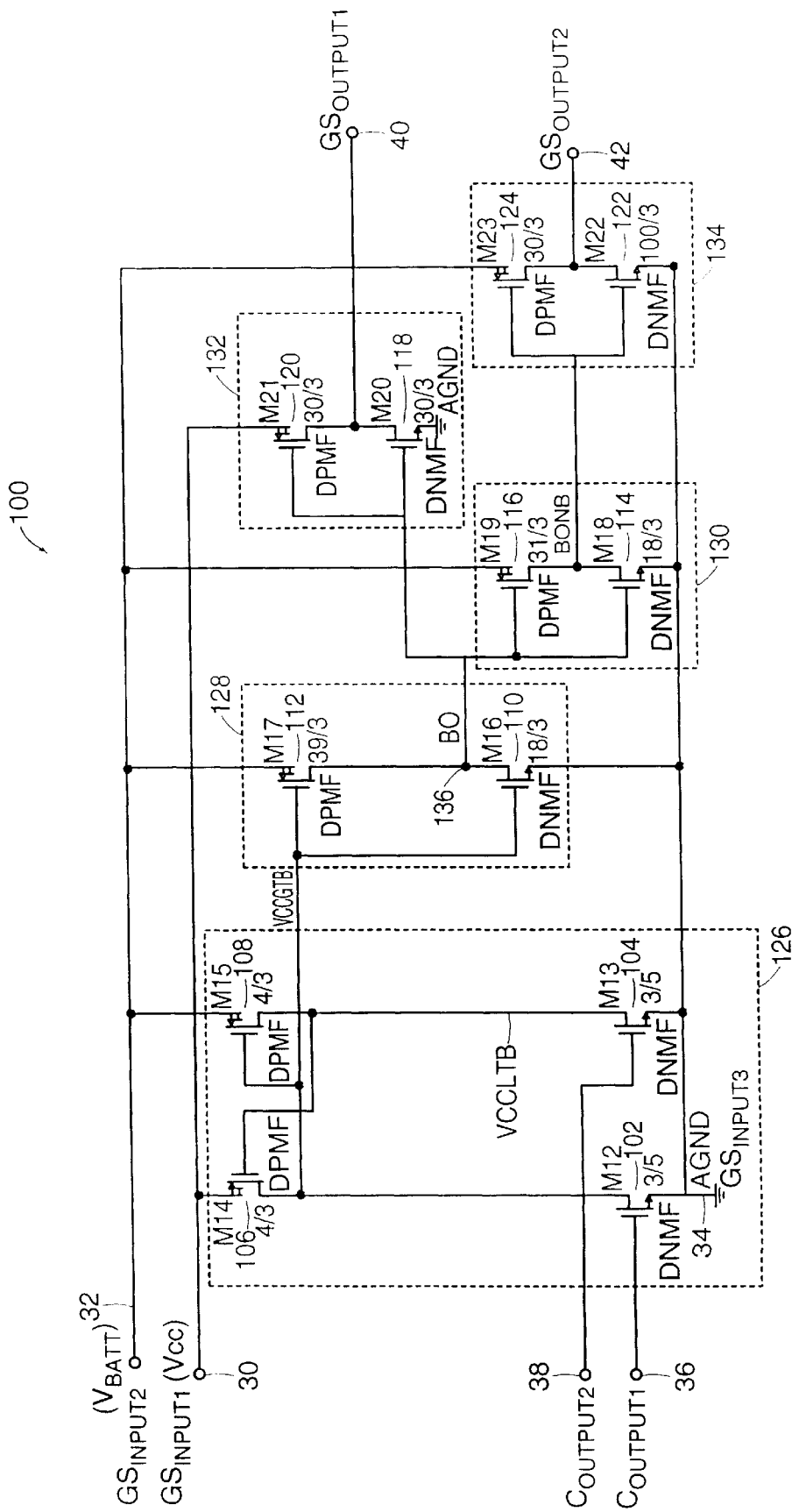
FIG. 3 is a schematic diagram of an embodiment of the gain stage of the voltage comparator circuit of FIG. 1.

FIG. 3 shows a more detailed schematic of one embodiment 100 of the gain stage 14 shown in FIG. 1. The purpose of the gain stage 14 is to amplify the two comparator stage output voltages $C_{OUTPUT1}$ and $C_{OUTPUT2}$ to obtain full CMOS level signals as outputs to the gain stage, $GS_{OUTPUT1}$ and $GS_{OUTPUT2}$, respectively. The gain stage 100 includes eleven transistors M12 102, M13 104, M14 106, M15 108, M16 110, M17 112, M18 114, M19 116, M20 118, M21 120, M22 122, and M23 124. The transistors M12 102, M13 104, M14 106, M15 108 form the first stage 126 of the gain stage 100. The first stage 126 of the gain stage 100 generates a single output signal VCCGTB from the two output signals $C_{OUTPUT1}$ and $C_{OUTPUT2}$ received on the input terminals 36 and 38 respectively. As described above, if the second comparator stage input voltage $C_{INPUT2}$ ($V_{BATT}$) is greater than the first comparator stage input voltage $C_{INPUT1}$ ($V_{CC}$), the output voltage $C_{OUTPUT1}$ is high and the output voltage $C_{OUTPUT2}$ is low. This condition causes the transistors M12 102 and M15 108 to turn on and the transistors M13 104 and M14 106 to turn off. The single output signal VCCGTB is electrically coupled to $GS_{INPUT3}$ (ground) through the transistor M12 102 and therefore is low.

If the first comparator stage input voltage $C_{INPUT1}$ ($V_{CC}$) is greater than the second comparator stage input voltage $C_{INPUT2}$ ($V_{BATT}$), the output voltage $C_{OUTPUT1}$ is low and the output voltage $C_{OUTPUT2}$ is high. This condition causes the transistors M13 104 and M14 106 to turn on and the transistors M12 102 and M15 108 to turn off. The single output signal VCCGTB is electrically coupled to the first gain stage input voltage $GS_{INPUT1}$ ($V_{CC}$) through the transistor M14 106 and therefore is high.

The gain stage 100 also includes four inverters 128, 130, 132 and 134. Each of the four inverters 128, 130, 132 and 134 comprise a pair of transistors. The first inverter 128 includes the transistors M16 110 and M17 112. The second inverter 130 includes the transistors M18 114 and M19 116.

The third inverter 132 includes the transistors M20 118 and M21 120. Finally, the fourth inverter 134 includes the transistors M22 122 and M23 124. The sources of the transistors M17 112 and M23 124 are electrically coupled to the second input terminal 31 and receive the second gain stage input voltage $GS_{INPUT2}$ ($V_{BATT}$); and the sources of the transistors M19 116 and M21 120 are electrically coupled to the first input terminal 30 and receive the first gain stage input voltage $GS_{INPUT1}$ ($V_{CC}$).

Continuing the discussion of the operation of the gain stage 100 from above, if the second comparator stage input voltage $C_{INPUT2}$ ($V_{BATT}$) is greater than the first comparator stage input voltage $C_{INPUT1}$ ($V_{CC}$), the single output voltage VCCGTB from the first stage 126 of the gain stage 100 is equal to the third gain stage input voltage $GS_{INPUT3}$ (ground). VCCGTB being low causes the transistor M17 112 to turn on and the transistor M16 110 to turn off. The transistor M17 112 being on electrically couples the node 136 to the second input terminal 32 and causes the signal BO to be substantially equal to $GS_{INPUT2}$ ($V_{BATT}$) and therefore high. The signal BO being high causes the transistors M18 114 and M20 118 to turn on and the transistors M19 116 and M21 120 to turn off. The first output terminal 40 is electrically coupled to $GS_{INPUT3}$ (ground) through the transistor M20 118, thereby causing the output signal $GS_{OUTPUT1}$ to be low. The node 138 is electrically coupled to $GS_{INPUT3}$ (ground) through the transistor M18 114, thereby causing the signal BONB to be low. The signal BONB being low causes the transistor M22 122 to turn off and the transistor M23 124 to turn on. The second output terminal 42 is electrically coupled to the second input terminal 32 through the transistor M23 124, thereby causing the output voltage $GS_{OUTPUT2}$ to be substantially equal to $GS_{INPUT2}$ ($V_{BATT}$) and high.

In summary, when the second comparator stage input voltage $C_{INPUT2}$ ($V_{BATT}$) is greater than the first comparator stage input voltage $C_{INPUT1}$ ($V_{CC}$), the first input signal $C_{OUTPUT1}$ to the gain stage 100 is high, the second input signal $C_{OUTPUT2}$ to the gain stage 100 is low, the first output voltage $GS_{OUTPUT1}$ from the gain stage 100 is low and the second output voltage $GS_{OUTPUT2}$ from the gain stage 100 is high. When $C_{INPUT2}$ ($V_{BATT}$) is greater than $C_{INPUT1}$ ($V_{CC}$), the voltages corresponding to logic high are substantially equal to $V_{BATT}$ and the voltages corresponding to logic low are substantially equal to ground.

If the first comparator stage input voltage $C_{INPUT1}$ ($V_{CC}$) is greater than the second comparator stage input voltage $C_{INPUT2}$ ($V_{BATT}$), the single output voltage VCCGTB from the first stage 126 of the gain stage 100 is high ($V_{CC}$). VCCGTB being high causes the transistor M16 110 to turn on and the transistor M17 112 to turn off. The transistor M16 110 being on electrically couples the node 136 to the third input terminal 34 and causes the signal BO to be substantially equal to $GS_{INPUT3}$ (ground) and therefore low. The signal BO being low causes the transistors M19 116 and M21 120 to turn on and the transistors M18 114 and M20 118 to turn off. The first output terminal 40 is electrically coupled to the first input terminal 30 through the transistor M21 120, thereby causing the output signal $GS_{OUTPUT1}$ to be substantially equal to $GS_{INPUT1}$ ($V_{CC}$) or high. The node 138 is electrically coupled to the first input terminal 30 through the transistor M19 116, thereby causing the signal BONB to be substantially equal to $GS_{INPUT1}$ ($V_{CC}$) or high. The signal BONB being high causes the transistor M22 122 to turn on and the transistor M23 124 to turn off. The second output terminal 42 is electrically coupled to the third input terminal 34 through the transistor M22 122, thereby causing the output voltage $GS_{OUTPUT2}$ to be substantially equal to $GS_{INPUT3}$ (ground) or low.

In summary, when the first comparator stage input voltage $C_{INPUT1}$ ($V_{CC}$) is greater than the second comparator stage input voltage $C_{INPUT2}$ ($V_{BATT}$), the first input signal $C_{OUTPUT1}$ to the gain stage 100 is low, the second input signal $C_{OUTPUT2}$ to the gain stage 100 is high, the first output voltage $GS_{OUTPUT1}$ from the gain stage 100 is high and the second output voltage $GS_{OUTPUT2}$ from the gain stage 100 is low. In one embodiment, when $V_{CC}$ is greater than $V_{BATT}$, the voltages corresponding to logic high are substantially equal to $V_{CC}$ and the voltages corresponding to logic low are substantially equal to ground.

Below is a table summarizing the states of the transistors and output signals for the case in which the first comparator stage input voltage $C_{INPUT1}$ ($V_{CC}$) is greater than the second comparator stage input voltage $C_{INPUT2}$ ($V_{BATT}$) and the case in which the second comparator stage input voltage $C_{INPUT2}$ ($V_{BATT}$) is greater than the first comparator stage input voltage $C_{INPUT1}$ ($V_{CC}$).

TABLE 2

TRANSISTOR AND OUTPUT VOLTAGE STATES FOR THE GAIN STAGE

|  | $C_{INPUT} > C_{INPUT1}$ ($V_{BATT} > VCC$) | $C_{INPUT1} > C_{INPUT2}$ ($V_{CC} > V_{BATT}$) |
|---|---|---|
| M12 | ON | OFF |
| M13 | OFF | ON |
| M14 | OFF | ON |
| M15 | ON | OFF |
| M16 | OFF | ON |
| M17 | ON | OFF |
| M18 | ON | OFF |
| M19 | OFF | ON |
| M20 | ON | OFF |
| M21 | OFF | ON |
| M22 | OFF | ON |
| M23 | ON | OFF |
| $C_{OUTPUT1}$ | HIGH | LOW |
| $C_{OUTPUT2}$ | LOW | HIGH |
| VCCGTB | LOW (GND) | HIGH ($V_{CC}$) |
| BO | HIGH ($V_{BATT}$) | LOW (GND) |
| BONB | LOW | HIGH ($V_{CC}$) |
| $GS_{OUTPUT1}$ | LOW | HIGH ($V_{CC}$) |
| $GS_{OUTPUT2}$ | HIGH | LOW |

As it has been shown, in one embodiment the voltages corresponding to logic high are equal to the highest potential in the circuit. For example, when $V_{BATT}$ is greater than $V_{CC}$, the voltages corresponding to logic high are substantially equal to $V_{BATT}$ and when $V_{CC}$ is greater than $V_{BATT}$, the voltages corresponding to logic high are substantially equal to $V_{CC}$.

Figure 4:
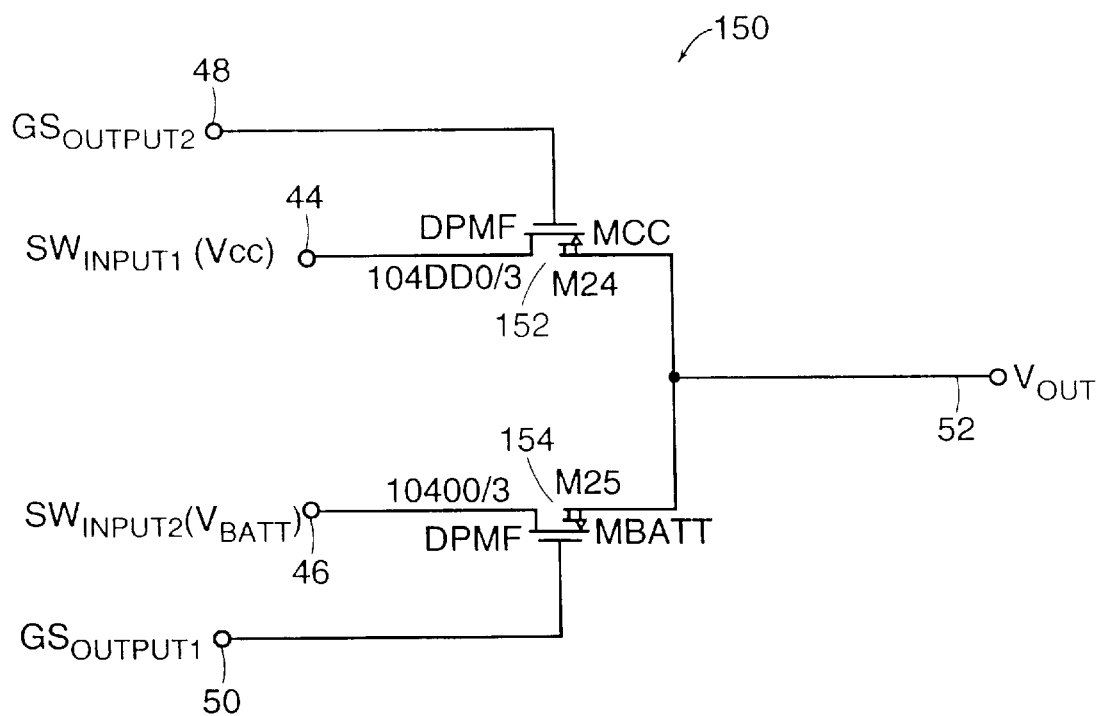
FIG. 4 is a schematic diagram of an embodiment of the switch of the voltage comparator circuit of FIG. 1.

FIG. 4 shows a more detailed schematic of one embodiment 150 of the switch 16 shown in FIG. 1. The purpose of the switch 16 is to produce a single output voltage $V_{OUT}$ which is substantially equal to the highest potential of the voltage comparator circuit 10. For example, if $V_{CC}$ ($C_{INPUT1}$) is greater than $V_{BATT}$ ($C_{INPUT2}$), $V_{OUT}$ will be substantially equal to $V_{CC}$ ($SW_{INPUT1}$) and if $V_{BATT}$ ($C_{INPUT2}$) is greater than $V_{CC}$ ($C_{INPUT1}$), then $V_{OUT}$ will be substantially equal to $V_{BATT}$ ($SW_{INNPUT2}$). The switch 150 includes two transistors M24 152 and M25 154. The switch 150 generates a single output voltage $V_{OUT}$ as a function of the two signals $GS_{OUTPUT1}$ and $GS_{OUTPUT2}$ received from the gain stage 14. As described above, if $C_{INPUT2}$ ($V_{BATT}$) is greater than $C_{INPUT1}$ ($V_{CC}$), the output signal $GS_{OUTPUT1}$ is low and the output signal $GS_{OUTPUT2}$ is high. This condition causes the transistor M24 152 to turn off and the transistor M25 154 to turn on. The output terminal 52 of the switch 150 is electrically coupled to the input terminal 46 through the transistor M25 154, thereby causing the output voltage $V_{OUT}$ to be substantially equal to $V_{BATT}$ ($SW_{INPUT2}$), the greater of the two input voltages $V_{CC}$ and $V_{BATT}$. Conversely, if $C_{INPUT2}$ ($V_{BATT}$) is less than $C_{INPUT1}$ ($V_{CC}$), the output signal $GS_{OUTPUT1}$ is high and the output signal $GS_{OUTPUT2}$ is low. This condition causes the transistor M24 152 to turn on and the transistor M25 154 to turn off. The output terminal 52 of the switch 150 is electrically coupled to the input terminal 44 through the transistor M24 152, thereby causing the output voltage $V_{OUT}$ to be substantially equal to $V_{CC}$ ($SW_{INPUT1}$), the greater of the two reference voltages $V_{CC}$ and $V_{BATT}$.

Figure 5:
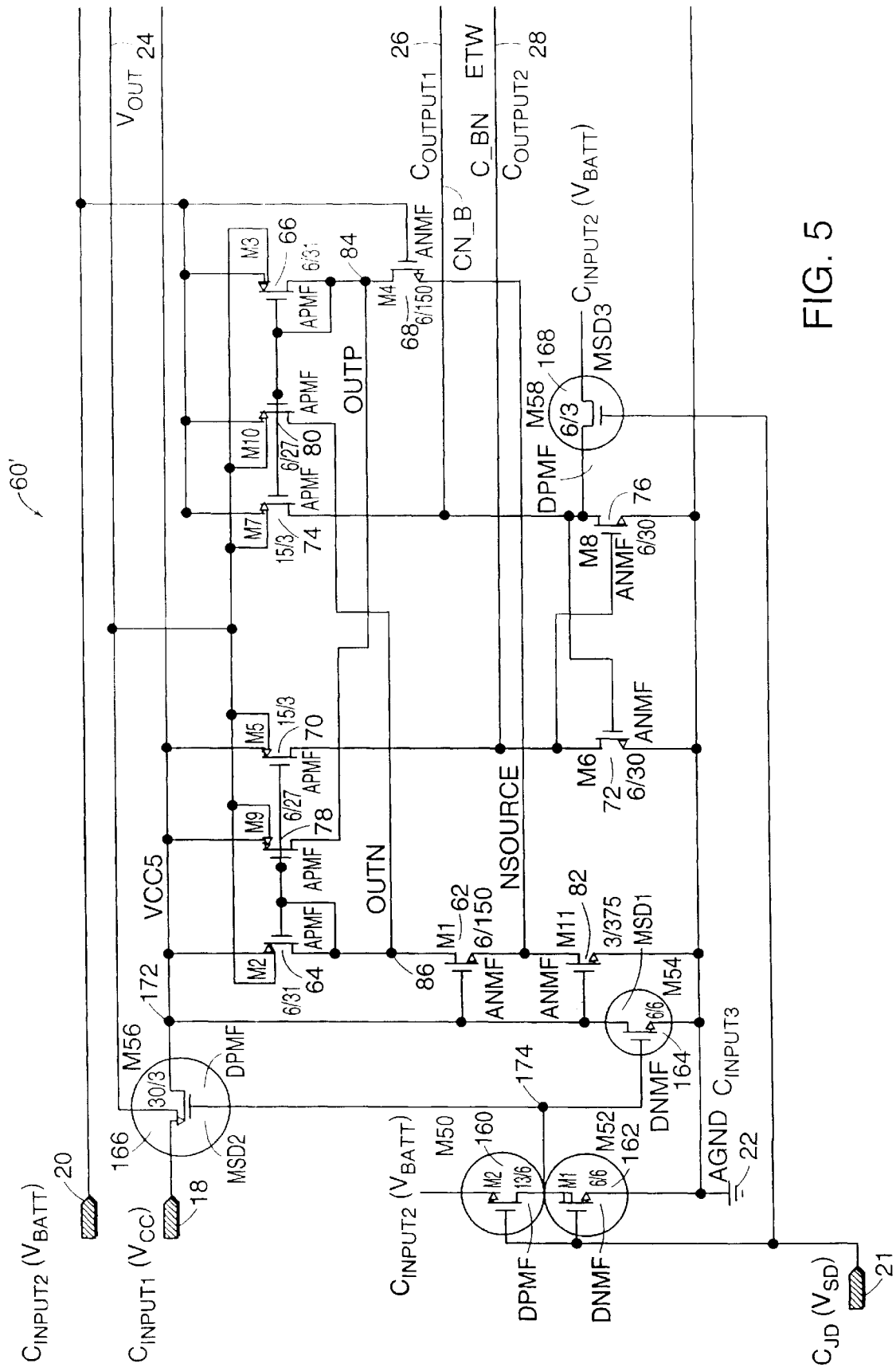
FIG. 5 is a schematic diagram of an embodiment of the comparator stage of the voltage comparator circuit of FIG. 1.

FIG. 5 shows a portion of an embodiment of the voltage comparator circuit 170 which includes the comparator stage 60 of FIG. 2 and additional PMOS transistors M50 160, M56 166 and M58 168, and NMOS transistors M52 162 and M54 154. A shutdown input signal ($C_{SD}$) applied at node 21 is generated in an external circuit which compares the first comparator stage input voltage ($V_{CC}$) to a predetermined voltage level. If $V_{CC}$ exceeds the predetermined voltage level, the shutdown input signal voltage ($V_{SD}$) is a high logic voltage and results in operation of the comparator as described above. If $V_{CC}$ is less than the predetermined voltage level, however, the shutdown input signal voltage ($V_{SD}$) is a low logic voltage (ground) which forces the comparator stage output voltages $C_{OUTPUT1}$ and $C_{OUTPUT2}$ to $V_{BATT}$ and ground, respectively. Thus the output voltage $V_{OUT}$ of the comparator circuit 60' will be at the battery voltage $V_{BATT}$. The operation of the comparator stage 60' will be explained for the case in which the first comparator stage input voltage $C_{INPUT1}$ ($V_{CC}$) drops below the predetermined voltage level, for example if the supply voltage fails, resulting in a low shutdown input signal voltage ($V_{SD}$).

Figure 6A:
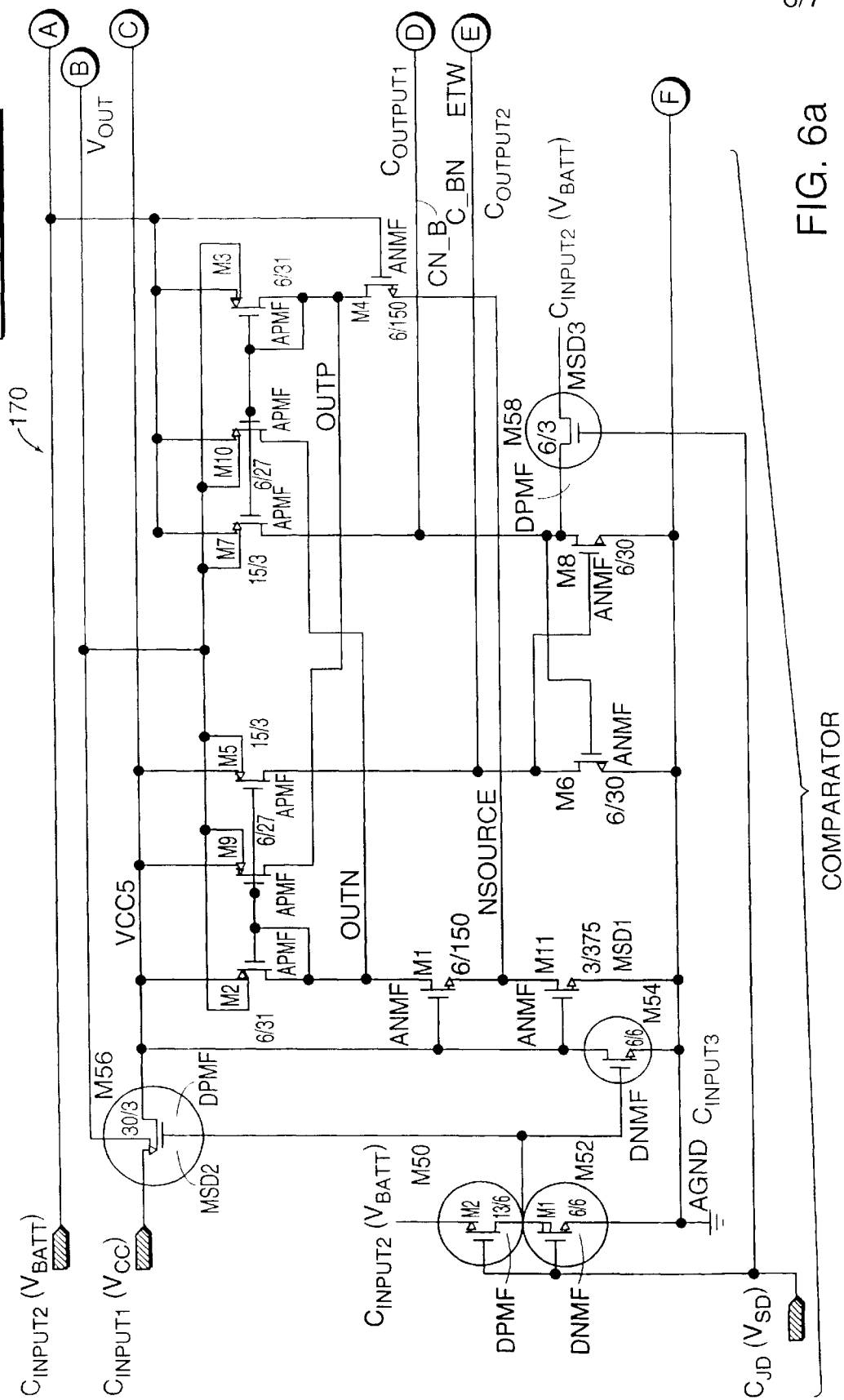
FIGS. 6A and 6B are sections of a schematic diagram of an embodiment of a voltage comparator circuit.
Figure 6B:
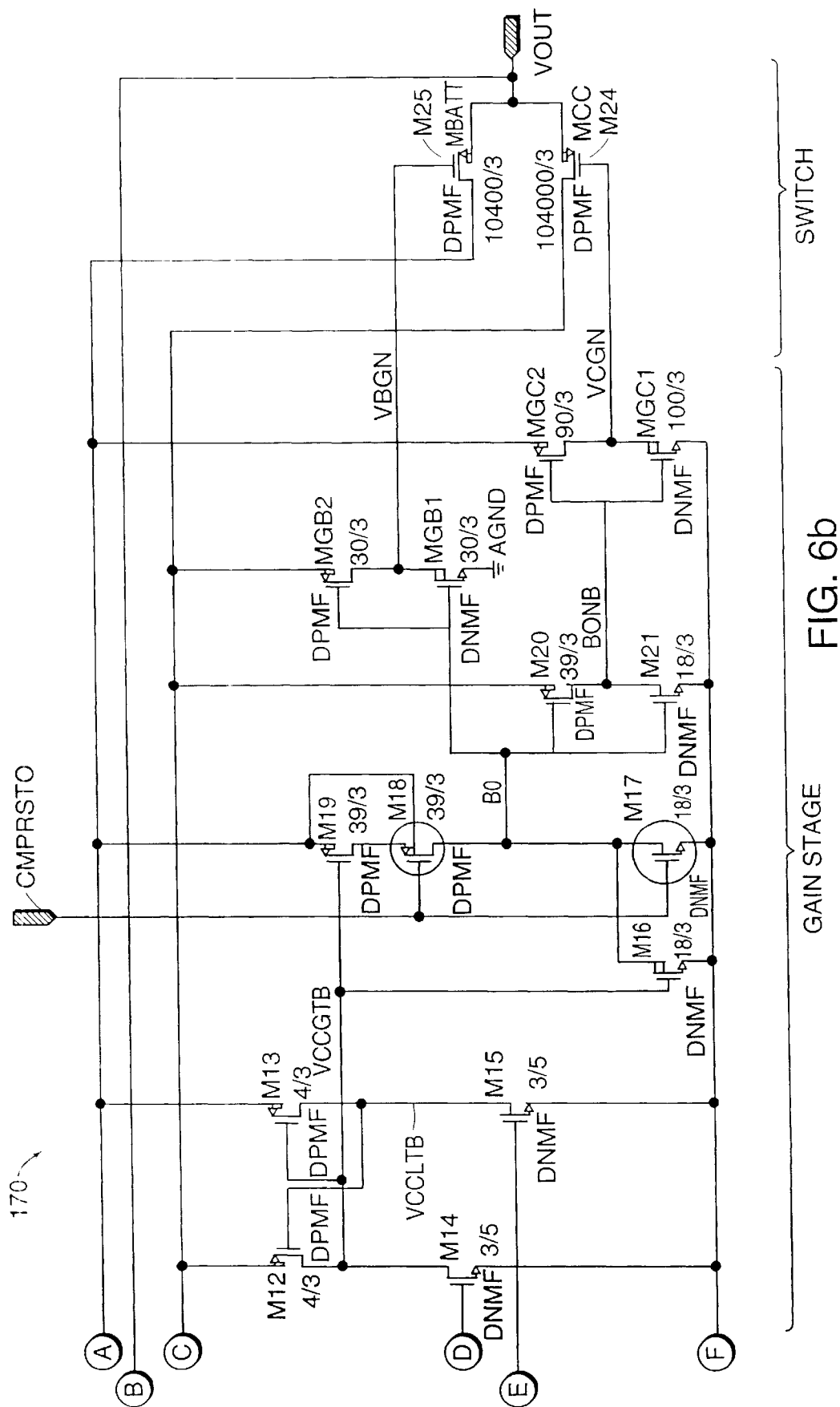

If the shutdown input signal voltage ($V_{SD}$) is low then transistor M50 160 is turned on, transistor M52 162 is turned off and node 174 is directly coupled to the second comparator stage input voltage $C_{INPUT2}$ ($V_{BATT}$). This causes transistor M54 164 to turn on and couples node 172 to ground. Similarly, transistor M56 166 is turned off, thus decoupling the first comparator stage input $C_{INPUT1}$ from the comparator stage 60'. The low shutdown input signal voltage ($V_{SD}$) also turns on transistor M58 168 which upon turning on, turns on transistor M6 72. Thus $V_{BATT}$ is applied to the first comparator stage output $C_{INPUT1}$ and the second comparator stage output $C_{OUTPUT2}$ is coupled to ground. FIGS. 6A and 6B show an embodiment of the voltage comparator circuit 170 including the comparator stage 60' of FIG. 5 which includes the shutdown circuit, the gain stage 100 of FIG. 3 and the switch 150 of FIG. 4. With this circuit 170, when the shutdown input signal voltage (($V_{SD}$) is low, the voltage at $C_{OUTPUT1}$ is high (equal to $V_{BATT}$), the voltage at $C_{OUTPUT2}$ is low (equal to ground) and the comparator circuit output voltage ($V_{OUT}$) is equal to $V_{BATT}$. When the shutdown input signal voltage ($V_{SD}$) is high and the first comparator stage input voltage $C_{INPUT1}$ ($V_{CC}$) is greater than the second comparator stage input voltage $C_{INPUT2}$ ($V_{BATT}$), the voltage at $C_{OUTPUT1}$ is approximately ground and the voltage at $C_{OUTPUT2}$ is equal to $V_{CC}$. When the shutdown input signal voltage ($V_{SD}$) is high and the first comparator stage input voltage $C_{INPUT1}$ ($V_{CC}$) is less than the second comparator stage input voltage $C_{INPUT2}$ ($V_{BATT}$), the voltage at $C_{OUTPUT1}$ is equal to $V_{BATT}$ and the voltage at $C_{OUTPUT2}$ is approximately ground.

Having described preferred embodiments of the invention, it will now become apparent to one of skill in the art that other embodiments incorporating the concepts may be used. It is felt, therefore, that these embodiments should not be limited to disclosed embodiments.

What is claimed is:

1. A voltage comparator circuit comprising:

a comparator stage comprising:
   a first comparator input terminal;
   a second comparator input terminal;
   a third comparator input terminal;
   a fourth comparator input terminal;
   a first comparator output terminal; and
   a second comparator output terminal, said comparator stage producing a first comparator output voltage at said first comparator output terminal equal to one of a first comparator voltage and a second comparator voltage and producing a second comparator output voltage at said second comparator output terminal equal to one of said second comparator voltage and a third comparator voltage, in response to a first comparator input voltage applied to said first comparator input terminal, a second comparator input voltage applied to said second comparator input terminal, and a third comparator input voltage applied to said third comparator input terminal; and a switch comprising a first switch input terminal and a second switch input terminal in electrical communication with said first comparator output terminal and said second comparator output terminal, respectively, and a switch output terminal in electrical communication with said fourth comparator input terminal, said switch producing a switch output voltage at said switch output terminal substantially equal to one of a first reference voltage and a second reference voltage in response to a first switch input voltage applied to said first switch input terminal and a second switch input voltage applied to said second switch input terminal.

2. The voltage comparator circuit of claim 1 wherein said first comparator output voltage is substantially equal to said first comparator voltage and said second comparator output voltage is substantially equal to said second comparator voltage when said second comparator input voltage applied to said second comparator input terminal is greater than said first comparator input voltage applied to said first comparator input terminal.

3. The voltage comparator circuit of claim 1 wherein said switch output voltage is substantially equal to said second reference voltage when a voltage substantially equal to said second comparator voltage is applied to said first switch input terminal and a voltage substantially equal to said first comparator voltage is applied to said second switch input terminal.

4. A voltage comparator circuit comprising:

a comparator stage comprising:
   a first comparator input terminal;
   a second comparator input terminal;
   a third comparator input terminal;
   a fourth comparator input terminal;
   a first comparator output terminal; and
   a second comparator output terminal, said comparator stage producing a first comparator output voltage at said first comparator output terminal equal to one of a first comparator voltage and a second comparator voltage and producing a second comparator output voltage at said second comparator output terminal equal to one of said second comparator voltage and a third comparator voltage, in response to a first comparator input voltage applied to said first comparator input terminal and a second comparator input voltage applied to said second comparator input terminal;

an inverting gain stage comprising:
- a first gain input terminal and a second gain input terminal in electrical communication with said first comparator output terminal and said second comparator output terminal, respectively;
- a first gain output terminal; and
- a second gain output terminal, said inverting gain stage producing a first gain output voltage at said first gain output terminal equal to one of a first gain voltage and a second gain voltage and a second gain output voltage at said second gain output terminal substantially equal to one of said second gain voltage and a third gain voltage in response to a first gain input voltage applied to said first gain input terminal and a second gain input voltage applied to said second gain input terminal; and a switch comprising a first switch input terminal and a second switch input terminal in electrical communication with said first gain output terminal and said second gain output terminal, respectively, a third switch input terminal, a fourth switch input terminal, and a switch output terminal in electrical communication with said fourth comparator input terminal, said switch producing a switch output voltage at said switch output terminal substantially equal to one of a first reference voltage applied to said third switch input terminal and a second reference voltage applied to said fourth switch input terminal in response to a first switch input voltage applied to said first switch input terminal and a second switch input voltage applied to said second switch input terminal.

5. The voltage comparator circuit of claim 4 wherein said first comparator output voltage is substantially equal to said first comparator voltage and said second comparator output voltage is substantially equal to said second comparator voltage when said second comparator input voltage applied to said second comparator input terminal is greater than said first comparator input voltage applied to said first comparator input terminal.

6. The voltage comparator circuit of claim 4 wherein said first gain output voltage is substantially equal to said second comparator voltage and said second gain output voltage is substantially equal said first comparator voltage when said first gain input voltage applied to said first gain input terminal is substantially equal to said first comparator voltage and said second gain input voltage applied to said second gain input terminal is substantially equal to said second comparator voltage.

7. The voltage comparator circuit of claim 4 wherein said switch output voltage is substantially equal to said second reference voltage applied to said fourth switch input terminal when a voltage substantially equal to said second comparator voltage is applied to said first switch input terminal and a voltage substantially equal to said first comparator voltage is applied to said second switch input terminal.

8. The voltage comparator circuit of claim 4 wherein said inverting gain stage further comprises a third gain input terminal for application of a third gain input voltage substantially equal to said first comparator input voltage and a fourth gain input terminal for application of a fourth gain input voltage substantially equal to said second comparator input voltage.

9. A voltage comparator circuit comprising:

a comparator stage comprising first, second, third, and fourth comparator input terminals, and first and second comparator output terminals, said comparator stage producing a first comparator output voltage at said first comparator output terminal substantially equal to one of a first reference voltage applied to said first comparator input terminal and a third reference voltage applied to said third comparator input terminal in response to said first reference voltage applied to said first comparator input terminal and a second reference voltage applied to said second comparator input terminal, said comparator stage producing a second comparator output voltage at said second comparator output terminal substantially equal to one of said second reference voltage applied to said second comparator input terminal and said third reference voltage applied to said third comparator input terminal in response to said first reference voltage applied to said first comparator input terminal and said second reference voltage applied to said second comparator input terminal;

an inverting gain stage comprising first, second, third, fourth, and fifth gain input terminals, and first and second gain output terminals, said first and second gain input terminals in electrical communication with said first and second comparator output terminals, respectively, said inverting gain stage producing a first gain output voltage at said first gain output terminal substantially equal to one of a second gain input voltage applied to said second gain input terminal and said third reference voltage applied to said third gain input terminal in response to a first gain input voltage applied to said first gain input terminal and said second gain input voltage applied to said second gain input terminal, said inverting gain stage producing a second gain output voltage at said second gain output terminal substantially equal to one of said first gain input voltage applied to said first gain terminal and said third reference voltage applied to said third gain input terminal in response to said first gain input voltage applied to said first gain input terminal and said second gain input voltage applied to said second gain input terminal; and a switch comprising first and second switch input terminals in electrical communication with said first and second gain output terminals, respectively, third and fourth switch input terminals in electrical communication with said first and second comparator input terminals, respectively, and a switch output terminal in electrical communication with said fourth comparator input terminal, said switch producing a switch output voltage at said switch output terminal substantially equal to one of said first reference voltage applied to said third switch input terminal and said second reference voltage applied to said fourth switch input terminal in response to a first switch voltage applied to said first switch input terminal and a second switch voltage applied to said second switch input terminal.

10. A method for applying one of a first reference voltage and a second reference voltage to a circuit, comprising the steps of:

comparing a first reference voltage and a second reference voltage;

generating a first output voltage substantially equal to one of said second reference voltage and a third reference voltage in response to said comparison and further in response to a third input voltage;

generating a second output voltage substantially equal to one of said first and third reference voltages in response to said comparison and further in response to said third input voltage; and generating a voltage comparator output voltage substantially equal to one of said first and second reference voltages in response to said first and second output voltages.

11. The method of claim 10 further comprising the step of applying said voltage comparator output voltage as said third input voltage.

12. A method for applying one of a first reference voltage and a second reference voltage to a circuit, comprising the steps of:

comparing a first reference voltage and a second reference voltage;

generating a first output voltage substantially equal to one of said second reference voltage and a third reference voltage in response to said comparison;

generating a second output voltage substantially equal to one of said first and third reference voltages in response to said comparison;

generating a third output voltage substantially equal to one of said first and third reference voltages in response to said first and second output voltages;

generating a fourth output voltage substantially equal to one of said second and third reference voltages in response to said first and second output voltages; and generating a voltage comparator output voltage substantially equal to one of said first and second reference voltages in response to said third and fourth output voltages.

* * * * *